(12) United States Patent
Lu et al.

(10) Patent No.: US 8,628,897 B1
(45) Date of Patent: Jan. 14, 2014

(54) EXTREME ULTRAVIOLET LITHOGRAPHY PROCESS AND MASK

(75) Inventors: Yen-Cheng Lu, New Taipei (TW);
Shinn-Sheng Yu, Hsinchu (TW);
Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 13/542,458

(22) Filed: Jul. 5, 2012

(51) Int. Cl.
*G03F 1/24* (2012.01)
*G03F 1/22* (2012.01)

(52) U.S. Cl.
USPC .................................................. 430/5

(58) Field of Classification Search
USPC .................. 430/5, 322, 323; 378/35
See application file for complete search history.

(56) References Cited

U.S. PATENT DOCUMENTS

2013/0157177 A1* 6/2013 Yu et al. .......................... 430/5

* cited by examiner

*Primary Examiner* — Stephen Rosasco
(74) *Attorney, Agent, or Firm* — Haynes and Boone, LLP (57) ABSTRACT

A process of an extreme ultraviolet lithography (EUVL) is disclosed. The process includes receiving an extreme ultraviolet (EUV) mask with multiple states. Different states of the EUV mask are assigned to adjacent polygons and adjacent sub-resolution polygons. The EUV mask is exposed by a nearly on-axis illumination (ONI) with partial coherence σ less than 0.3 to produce diffracted lights and non-diffracted lights. Most of the non-diffracted lights are removed. The diffracted lights and the not removed non-diffracted lights are collected and directed to expose a target by a projection optics box.

20 Claims, 5 Drawing Sheets

EXTREME ULTRAVIOLET LITHOGRAPHY PROCESS AND MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include multiple electron beam maskless lithography, nanoimprint lithography, and direct self-assembly.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, for AltPSM, one of the methods to generate a phase-shifting region without much attenuation in reflectivity is to create a step of appropriate height on a substrate and then form a multilayer (ML) over the step. However, the ML tends to smooth out the step height, leading to a large transition area between phase-shifting and non-phase-shifting regions. This will limit the achievable resolution limit. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
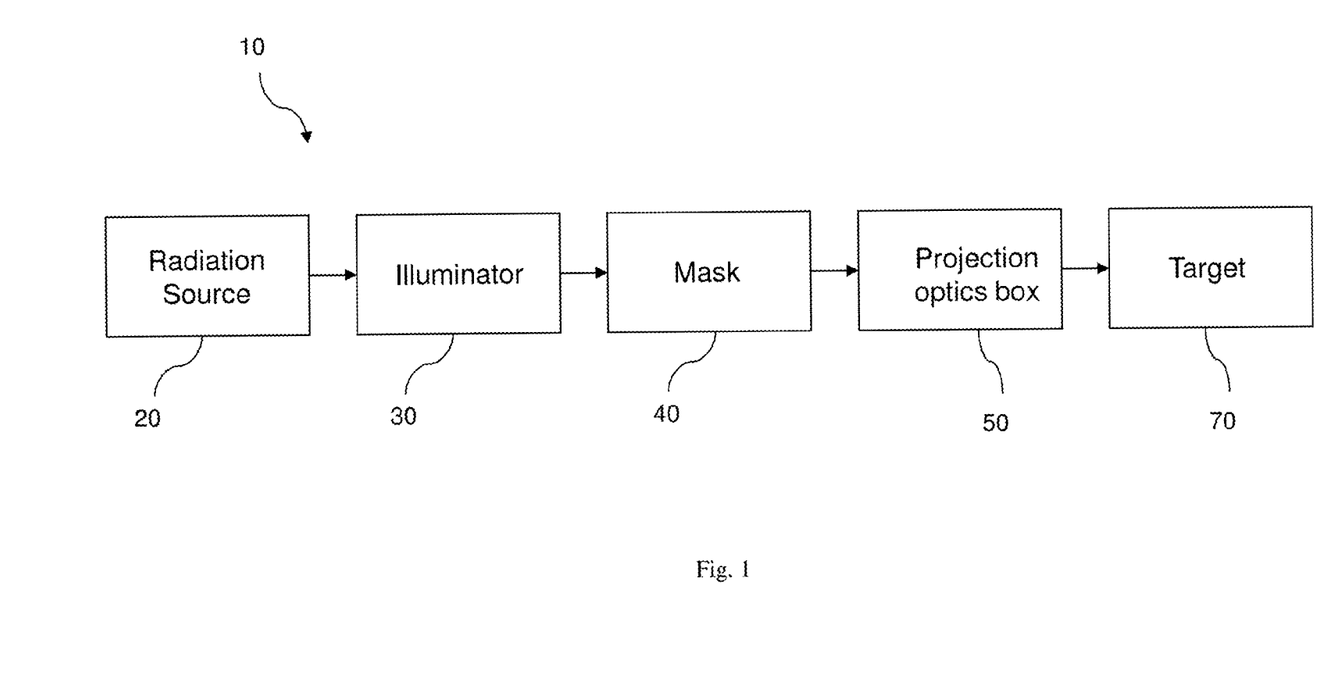
FIG. 1 is a block diagram of a lithography process for implementing one or more embodiments of the present invention.

Referring to FIG. 1, an EUV lithography process 10 that may benefit from one or more embodiments of the present invention is disclosed. The EUV lithography process 10 employs an EUV radiation source 20 having a wavelength of about 1-100 nm.

The EUV lithography process 10 also employs an illuminator 30. The illuminator 30 may comprise refractive optics, such as a single lens or a lens system having multiple lenses (zone plates) or reflective optics, such as a single mirror or a mirror system having multiple mirrors in order to direct light from the radiation source 20 onto the mask 40. In the EUV wavelength range, reflective optics is employed generally. Refractive optics, however, can also be realized by e.g., zone-plates. In the present embodiment, the illuminator 30 is set up to provide an on-axis illumination (ONI) to illuminate the mask 40. In ONI, all incoming light rays incident on the mask at the same angle of incidence (AOI), e.g., AOI=6°, same as that of the chief ray. In real situation, there may be some angular spread of the incident light. For example, if a disk illumination (i.e., the shape of the illumination on the pupil plane being like a disk centered at the pupil center) of a small partial coherence σ, e.g., σ=0.3, is employed, the maximum angular deviation from the chief ray is $\sin^{-1}[m\times\sigma\times NA]$, where m and NA are the magnification and numerical aperture, respectively, of the imaging system (i.e., the projection optics box (POB) 50 to be detailed below). Partial coherence σ can also be used to describe a point source which produces a plane wave illuminating the mask 40. In this case, the distance from the pupil center to the point source in the pupil plane is NA×σ and the deviation of the AOI of the corresponding plane wave incident on the mask 40 from the chief ray is $\sin^{-1}$ [m×σ×NA]. In the present embodiment, it is sufficient to employ a nearly ONI consists of point sources with σ less than 0.3.

The EUV lithography process 10 also employs a mask 40 (in the present disclosure, the terms of mask, photomask, and reticle are used to refer to the same item). The mask 40 can be a transmissive mask or a reflective mask. In the present embodiment, the mask 40 is a reflective mask such as described in further detail below. The mask 40 may incorporate other resolution enhancement techniques such as attenuated phase-shifting mask (AttPSM) and sub-resolution assist features. Sub-resolution assist features are not printed on a final target, e.g., a semiconductor wafer. However, they help in increasing the exposure latitude (EL) or depth of focus (DOF) of main features.

In the present embodiment, there are main polygons, which represent circuit patterns, on the mask 40. There are also assist polygons, which are of sub-resolution, i.e., they are not printed on the wafer, or more specifically, on the field (the region without main polygons and assist polygons). Whether a polygon is printed or not depends not only on its size but also on the environment it is situated. For example, for long rectangles of width w and pitch 2w, if w is smaller than about λ/(2NA), they are not printed if ONI is employed. If the pitch is kept the same, i.e., rectangles are kept in dense environment, and the width is increased, they are still not printed even if the width is close to the pitch. If long rectangles becomes squares of size w×w, arranged like a checkerboard, the non-printable condition can be relaxed to about w less than λ/(1.414NA). Here, λ is a wavelength of the radiation source 20 and NA is a numerical aperture of a projection optics box 50.

The EUV lithography process 10 also employs a POB 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation).

Figure 2:
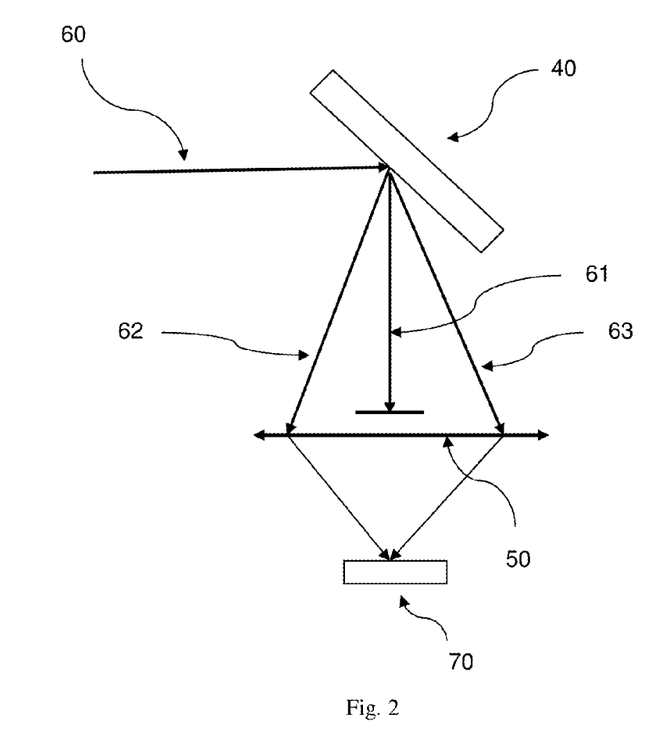
FIG. 2 is a diagrammatic perspective view of a projection optics box (POB) employed in the lithography process for implementing one or more embodiments of the present invention. Since a POB by reflective optics is difficult to sketch, the equivalent refractive optics is used to illustrate the underlying principle.

Referring to FIG. 2, an incident light ray 60, after being reflected from the mask 40, is diffracted into various diffraction orders due to presence of these mask patterns, such as a 0-th diffraction order ray 61, a −1-st diffraction order ray 62 and a +1-st diffraction order ray 63. For lithographic imaging, purely coherent illumination is generally not employed. Disk illumination with partial coherence σ being at most 0.3 generated by the illuminator 30 is employed. In the depicted embodiment, the non-diffracted light rays 61 are mostly (e.g., more than 70%) removed by, e.g., central obscuration in the pupil plane. The −1-st and +1-st diffraction order rays, 62 and 63, are collected by the POB 50 and directed to expose a target 70. Since the strength of the −1-st and +1-st diffraction order rays, 62 and 63, are well balanced, they interfere with each other and will generate a high contrast aerial image. Also, the −1-st and +1-st diffraction order rays, 62 and 63, are of the same distance from the pupil center in the pupil plane, and depth of focus (DOF) is maximized.

The target 70 includes a semiconductor wafer with a photosensitive layer (e.g., photoresist or resist), which is sensitive to the EUV radiation. The target 70 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a blank mask fabrication process and a mask patterning process. During the blank mask fabrication process, a blank mask is formed by depositing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity mask (BIM) and phase-shifting mask (PSM). An example BIM includes an almost totally absorptive region (also referring to as an opaque region) and a reflective region. In the opaque region, an absorber is present and an incident light beam is almost fully absorbed by the absorber. The absorber can be made of materials containing chromium, chromium oxide, chromium nitride, aluminum-copper, titanium, titanium nitride, tantalum, tantalum oxide, tantalum nitride, and tantalum boron nitride. In the reflective region, the absorber is removed and the incident light is reflected by a multilayer (ML), which will be described in further detail below. A PSM includes an absorptive region and a reflective region. A portion of the incident light reflects from the absorptive region with a proper phase difference with respect to a light reflected from the reflective region to enhance the resolution and imaging quality. The absorber of the PSM can be made by materials such as tantalum nitride and tantalum boron nitride at a specific thickness. The PSM can be attenuated PSM (AttPSM) or alternating PSM (AltPSM). An AttPSM usually has 2%-15% of reflectivity from its absorber, while an AltPSM usually has larger than 50% of reflectivity from its absorber.

Figure 3:
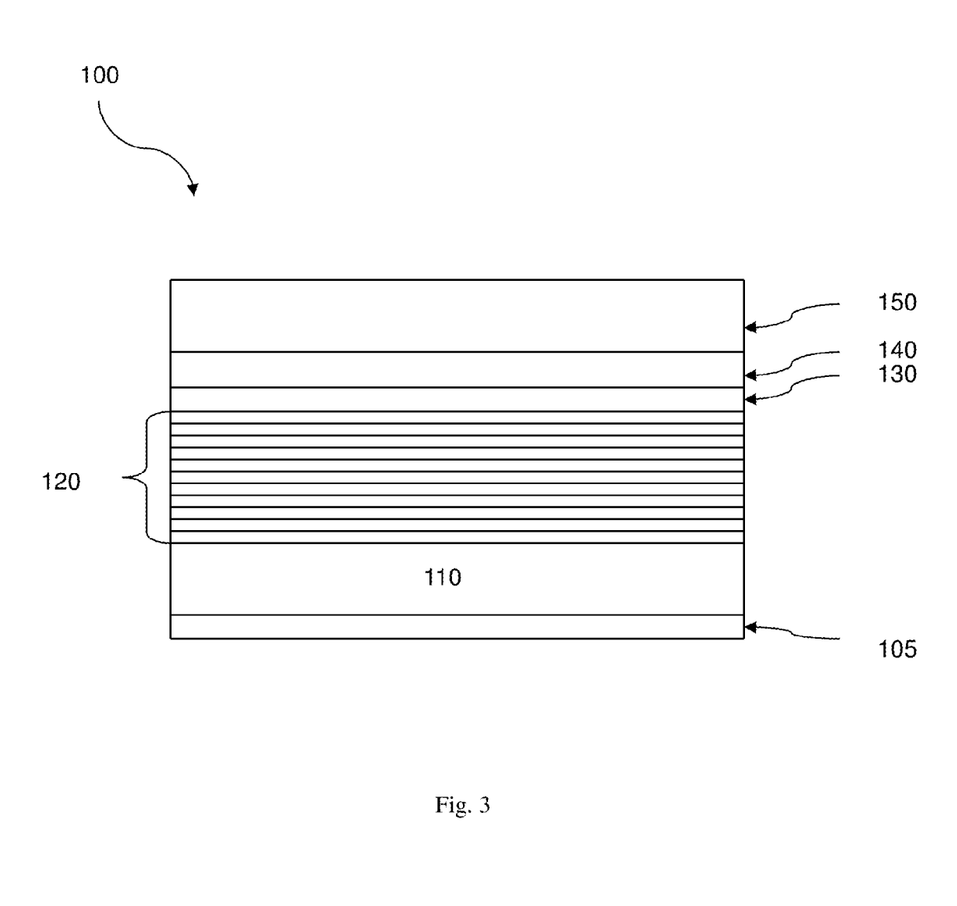
FIG. 3-4 are diagrammatic cross-sectional views of various aspects of one embodiment of an EUV mask at various stages of a lithography process constructed according to aspects of the present disclosure.

Referring to FIG. 3, a blank EUV mask 100 comprises a substrate 110 made of low thermal expansion material (LTEM). The LTEM material may include TiO2 doped SiO2, or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be deposited under (as shown in the figure) the LTEM substrate 110 for the electrostatic chucking purpose. In an embodiment, the conductive layer 105 includes chromium nitride (CrN), though other compositions are possible.

A reflective multilayer (ML) 120 is deposited over the LTEM substrate 110. According to Fresnel equations, light reflection occurs when light propagates across the interface between two materials of different refractive indices. The reflected light is larger when the difference of refractive indices is larger. To increase the reflected light, one may also increase the number of interfaces by depositing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 120 includes a plurality of layer pairs, such as molybdenum-silicon (Mo/Si) layer pairs (e.g., a layer of molybdenum above or below a layer of silicon in each layer pair). Alternatively, the ML 120 may include molybdenum-beryllium (Mo/

Be) layer pairs, or any layer pairs consisting of two materials or two material combinations with large difference in refractive indices and with small extinction coefficients. The thickness of each layer of the ML 120 depends on the EUV wavelength and the incident angle (on the mask). For a specified incident angle, the thickness of each layer of the ML 120 is adjusted to achieve maximal constructive interference for lights reflected at different interfaces of the ML 120. A typical number of layer pairs is 20-80, however any number of layer pairs is possible. In an embodiment, the ML 120 includes forty pairs of layers of Mo/Si. Each Mo/Si layer pair has a thickness of about 7 nm, with a total thickness of 280 nm. In this case, a reflectivity of about 70% is achieved.

A capping layer 130 is formed above the ML 120 to prevent oxidation of the ML. In the present embodiment, the capping layer 130 includes silicon with about 4-7 nm thickness. A buffer layer 140 is formed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the ML 120. In the present embodiment, the buffer layer 140 contains ruthenium (Ru) and is of the thickness of 2-5 nm. In one embodiment, the capping layer and the buffer layer is a single layer.

An absorption layer 150 is formed above the buffer layer 140. The absorption layer 150 preferably absorbs radiation in the EUV wavelength range projected onto a patterned EUV mask 200. The absorption layer 150 includes multiple film layers from a group of chromium, chromium oxide, titanium nitride, tantalum nitride, tantalum, titanium, or aluminum-copper, palladium, tantalum nitride, aluminum oxide, molybdenum (Mo), or other suitable materials. With a proper configuration of multiple film layers, the absorption layer 150 will provide process flexibility in a subsequent etching process by different etch characteristics of each film. In the present embodiment, the absorption layer 150 includes 83-nm of tantalum nitride.

One or more of the layers 105, 120, 130, 140 and 150 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 4:
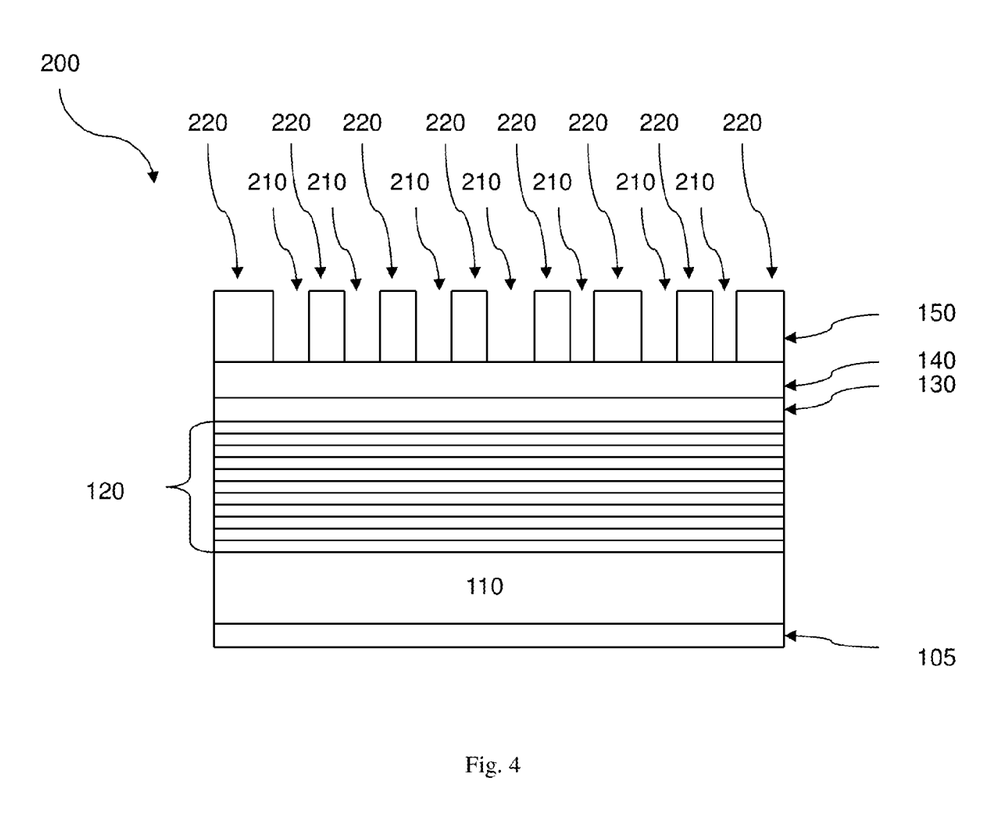

Referring to FIG. 4, in one of the present embodiments, the absorption layer 150 is patterned to form the design layout pattern EUV mask 200 with two states on the blank mask 100. The absorption layer 150 is patterned to form the state 210 by a patterning technique. A patterning process may include resist coating (e.g., spin-on coating), soft baking, mask aligning, exposure, post-exposure baking, developing the resist, rinsing, drying (e.g., hard baking), other suitable processes, and/or combinations thereof.

An etching process is followed to remove a portion of the patterned absorption layer 150 to form a first state 210. The etching process may include dry (plasma) etching, wet etching, and/or other etching methods. In the meantime, a region, where the absorption layer 150 remains, is defined as a second state 220.

Still referring to FIG. 4, now the EUV mask 200 comprises two states, 210, and 220. The reflection coefficients of state 210 and state 220 are r1 and r2, respectively. The two states are configured such that the absolute value of r1 is larger than the absolute value of r2.

Figure 5:
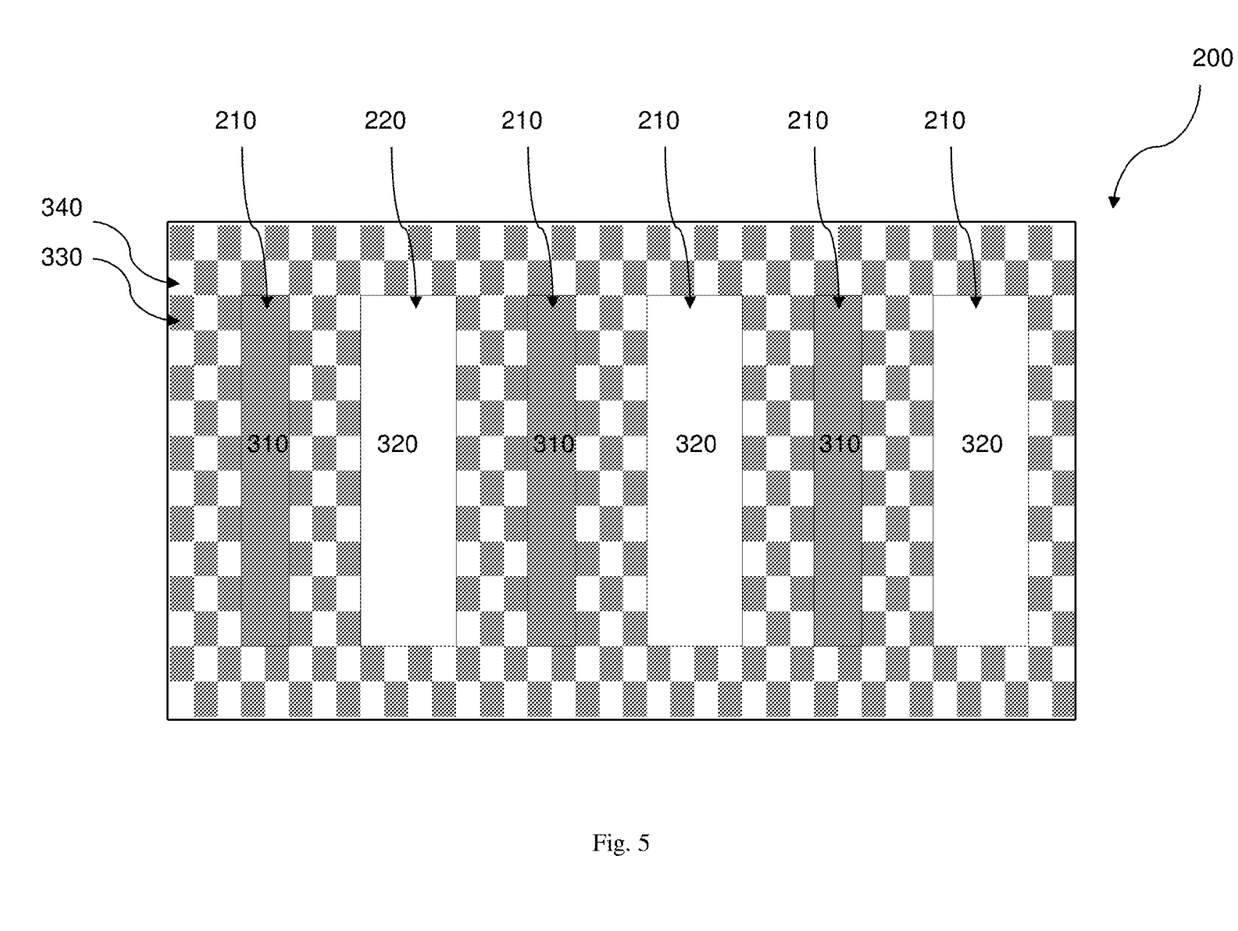
FIG. 5 is a diagrammatic perspective view of an EUV mask according to aspects of the present disclosure.

Referring to FIG. 5, there are main polygons (for circuit patterns) and assist polygons on the EUV mask 200. The assist polygons are so small that they are of sub-resolution to achieve for the field a quasi-uniform reflection coefficient, of which the absolute value is between those of r1 and r2. In the present embodiment, states 210 and 220 of the EUV mask 200 are assigned to a first main polygon 310 and a second main polygon 320, which is adjacent to the first main polygon, to reduce their spatial frequencies. All assist polygons 330 are assigned the same state, which is different from the state assigned to the field 340. That is, if all assist polygons 330 are assigned state 210, then the field 340 is assigned state 220. If all assist polygons 330 are assigned state 220, then the field 340 is assigned state 210. Main polygons, 310 and 320, and assist polygons 330 may touch or overlap each other.

The present disclosure is directed towards lithography systems and processes. In one embodiment, an extreme ultraviolet lithography (EUVL) process includes receiving an extreme ultraviolet (EUV) mask with multiple states. The EUV mask includes a first main polygon, a second main polygon adjacent to the first main polygon, and a plurality of assist polygons in a field (a region without main polygons and assist polygons). All of the main polygons, the assist polygons, and the field each have an associated state. The first main polygon has a state different from the state of the second main polygon. All of the assist polygons have a state different from the state of the field. The EUVL process also includes exposing the EUV mask by a nearly on-axis illumination (ONI) with partial coherence σ less than 0.3 to produce diffracted lights and non-diffracted lights, removing most of the non-diffracted lights, collecting and directing the diffracted lights and the not removed non-diffracted lights by a projection optics box (POB) to expose a target.

In another embodiment, an EUVL process includes receiving an EUV mask. The EUV mask includes a plurality of main polygons, a plurality of assist polygons in a field (a region without main polygons and assist polygons), a first state having a first reflection coefficient r1, a second state having a second reflection coefficient r2. The EUVL process also includes assigning different states of the EUV mask to adjacent main polygons and assigning a state to all assist polygons, which is different from the state of the field. The EUVL process also includes exposing the EUV mask by a nearly on-axis illumination (ONI) with partial coherence σ less than 0.3 to produce diffracted lights and non-diffracted lights, removing more than 70% of the non-diffracted lights, collecting and directing the diffracted lights and the not removed non-diffracted lights by a projection optics box (POB) to expose a semiconductor wafer.

The present disclosure is also directed towards masks. In one embodiment, an EUV mask includes a low thermal expansion material (LTEM) substrate, a reflective multilayer (ML) above one surface of the LTEM substrate, a conductive layer above an opposite surface of the LTEM substrate, a capping layer above the reflective ML, a buffer layer above the capping layer and a patterned absorption layer above the buffer layer. The patterned absorption layer defines multiple states in the EUV mask. Different states are assigned to adjacent main polygons and a state is assigned to all assist polygons, which is different from the state of the field Based on the above, it can be seen that the present disclosure offers the EUV lithography process 10. The EUV lithography process 10 employs a nearly ONI, e.g., a disk illumination with partial coherence σ smaller than 0.3 to expose an EUV mask to produce diffracted lights and non-diffracted lights. The EUV lithography process 10 removes more than 70% of the non-diffracted lights and utilizes mainly the diffracted lights from two symmetrically located (on the pupil plane) and intensity balanced −1-st and +1-st diffraction orders to expose a semiconductor wafer. The EUV lithography process 10 also employs an EUV mask with two states with pre-specified reflection coefficients. Adjacent main polygons are of different states and all assist polygons are of the same state, which is different from the state of the field. The EUV lithography process 10 demonstrates an enhancement of aerial image contrast for both line/space and end-end patterns, and achieves a high depth of focus (DOF) in a large pitch range. The EUV lithography process 10 provides a resolution enhancement technique for future nodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) process, comprising:
    receiving an extreme ultraviolet (EUV) mask, including:
        a first main polygon;
        a second main polygon adjacent to the first main polygon;
        a plurality of assist polygons; and
        a field (a region without main polygons and assist polygons), wherein each of the main polygons, the assist polygons, and the field has an associated state, wherein the state assigned to the first main polygon is different from the state assigned to the second main polygon, and wherein the plurality of assist polygons are assigned the same state, which is different from the state assigned to the field;
    exposing the EUV mask by a nearly on-axis illumination (ONI) with partial coherence σ less than 0.3 to produce diffracted lights and non-diffracted lights;
    removing a portion of the non-diffracted lights; and
    collecting and directing the diffracted lights and the not removed non-diffracted lights by a projection optics box (POB) to expose a target.

2. The process of claim 1, wherein the EUV mask comprises:
    a low thermal expansion material (LTEM) substrate;
    a reflective multilayer (ML) above one surface of the LTEM substrate;
    a conductive layer above an opposite surface of the LTEM substrate;
    a capping layer above the reflective ML;
    a buffer layer above the capping layer;
    an absorption layer above the buffer layer; and
    multiple states formed on the absorption layer.

3. The process of claim 2, wherein the capping layer and the buffer layer are a single layer.

4. The process of claim 1, wherein at least one assist polygon is a sub-resolution polygon, at least one edge of the assist polygon has a length smaller than λ/NA, where λ is a wavelength of a radiation source and NA is a numerical aperture of the projection optics box.

5. The process of claim 1, wherein at least one assist polygon is a sub-resolution polygon that includes a rectangle, at least one edge of the rectangle has a length smaller than λ/NA, where λ is a wavelength of a radiation source and NA is a numerical aperture of the projection optics box.

6. The process of claim 2, wherein the EUV mask includes two states: a first state of which the reflection coefficient is r1 and a second state of which the reflection coefficient is r2.

7. The process of claim 6, wherein the first state is configured by the buffer layer, the capping layer, and the ML; the second state is configured by the absorption layer, the buffer layer, the capping layer, and the ML.

8. The process of claim 6, wherein two states are configured as that the absolute value of r1 is larger than the absolute value of r2.

9. The process of claim 6, wherein the first and the second states are assigned to adjacent main polygons.

10. The process of claim 6, wherein the first state is assigned to all assist polygons and the second state is assigned to the field.

11. The process of claim 6, wherein the second state is assigned to all assist polygons and the first state is assigned to the field.

12. The process of claim 1, wherein main polygons and assist polygons touch or overlap each other.

13. The process of claim 1, wherein more than 70% of the non-diffracted lights are removed.

14. The process of claim 1, wherein collecting and directing the diffracted lights includes collecting and directing lights of −1-st and +1-st diffraction orders.

15. An extreme ultraviolet lithography (EUVL) process, comprising:
    receiving an EUV mask, including:
        a plurality of main polygons;
        a plurality of assist polygons;
        a field (a region without main polygons and assist polygons);
        a first state having a first reflection coefficient r1; and
        a second state having a second reflection coefficient r2;
    assigning different states of the EUV mask to adjacent main polygons;
    assigning to all assist polygons a state of the EUV mask, which is different from the state assigned to the field;
    exposing the EUV mask by a nearly on-axis illumination (ONI) with partial coherence σ less than 0.3 to produce diffracted lights and non-diffracted lights;
    removing more than 70% of the non-diffracted lights; and
    collecting and directing the diffracted lights and the not removed non-diffracted lights by a projection optics box (POB) to expose a semiconductor wafer.

16. The process of claim 15, wherein the two states are configured such that an absolute value of r1 is larger than an absolute value of r2.

17. The process of claim 15, wherein:
    the first state is configured by a buffer layer, a capping layer, and an ML of the EUV mask; and the second state is configured by an absorption layer, the buffer layer, the capping layer, and the ML of the EUV mask.

18. The process of claim 15, wherein main polygons and assist polygons touch or overlap each other.

19. The process of claim 17, wherein the capping layer and the buffer layer are a single layer.

20. An extreme ultraviolet lithography (EUVL) mask, comprising:
- a low thermal expansion material (LTEM) substrate;
- a reflective multilayer (ML) above one surface of the LTEM substrate;
- a conductive layer above an opposite surface of the LTEM substrate;
- a capping layer above the reflective ML;
- a buffer layer above the capping layer; and
- a patterned absorption layer above the buffer layer, wherein the patterned absorption layer defines multiple states, and further wherein different states are assigned to adjacent main polygons and a state is assigned to all assist polygons, the state being assigned to all assist polygons being different from the state assigned to a field.

* * * * *